United States Patent [19]

Rooney et al.

[11] Patent Number: 4,928,512
[45] Date of Patent: May 29, 1990

[54] DIE SET FOR THE FORMATION OF CAVITIES FOR METAL PACKAGES TO HOUSE ELECTRONIC DEVICES

[75] Inventors: James F. Rooney, Bethany; Harvey P. Cheskis, North Haven, both of Conn.

[73] Assignee: Olin Corporation, New Haven, Conn.

[21] Appl. No.: 270,919

[22] Filed: Nov. 14, 1988

[51] Int. Cl.⁵ .............................................. B21D 22/06
[52] U.S. Cl. .................................. 72/404; 72/412; 72/379
[58] Field of Search ................ 72/356, 354, 353, 352, 72/343, 334, 325, 340, 404, 379, 412

[56] References Cited

U.S. PATENT DOCUMENTS

| 458,381 | 8/1891 | Watson | 72/404 |
|---|---|---|---|
| 1,886,210 | 11/1932 | Mitchell . | |
| 1,995,357 | 3/1935 | Liss | 72/354 |
| 2,070,784 | 2/1937 | Cox | 72/334 |
| 2,485,354 | 10/1949 | Brennan . | |
| 2,669,769 | 2/1954 | Peterson | 72/340 |
| 2,748,464 | 6/1956 | Kaul | 72/356 |
| 2,909,281 | 10/1959 | Koskinen | 72/353 |
| 3,155,055 | 11/1964 | Nishkian | 72/334 |
| 3,174,318 | 3/1965 | Fox . | |
| 3,455,138 | 7/1969 | Zapf | 72/352 |
| 4,015,461 | 4/1977 | Schober . | |
| 4,252,011 | 2/1981 | MacNitt, Jr. et al. . | |
| 4,590,783 | 5/1986 | Tanaka et al. | 72/404 |
| 4,607,276 | 8/1986 | Butt . | |
| 4,682,414 | 7/1987 | Butt . | |
| 4,704,626 | 11/1987 | Mahulikar et al. . | |

FOREIGN PATENT DOCUMENTS

| 841436 | 6/1952 | Fed. Rep. of Germany | 72/340 |
|---|---|---|---|
| 20868 | 2/1982 | Japan | 72/352 |
| 199519 | 12/1982 | Japan | 72/354 |
| 25091 | 10/1914 | Norway | 72/354 |
| 593780 | 2/1978 | U.S.S.R. | 72/334 |

Primary Examiner—Daniel C. Crane
Attorney, Agent, or Firm—Gregory S. Rosenblatt; Paul Weinstein

[57] ABSTRACT

A die set includes a punch for stamping a cavity in a work piece to produce a flat base surface and sidewalls which are perpendicular to the base surface. A forming bushing applies a deformation stress perpendicular to the stress applied by the punch to direct metal flow. In one embodiment, the impact surface of the punch contains piercing points to increase the depth of penetration of the punch.

17 Claims, 3 Drawing Sheets

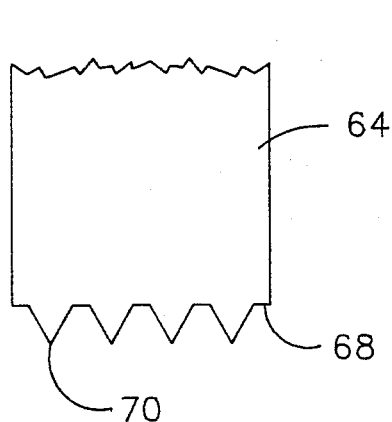
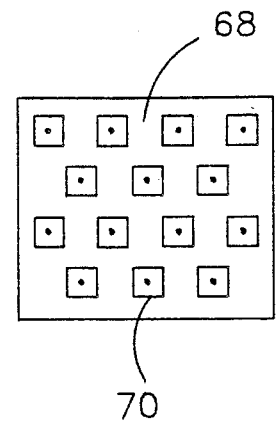
*FIG-3A*  *FIG-3B*
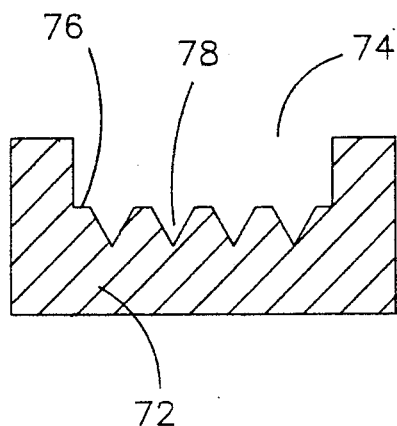
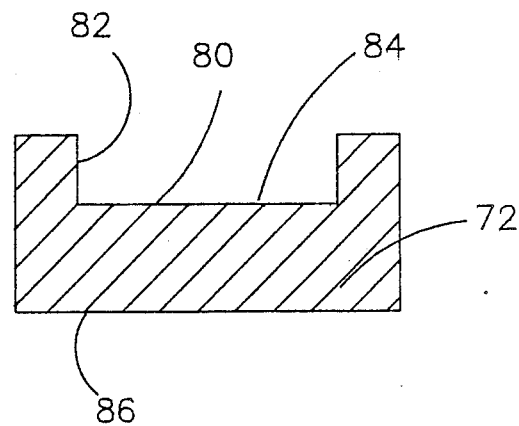
*FIG-4A*  *FIG-4B*

DIE SET FOR THE FORMATION OF CAVITIES FOR METAL PACKAGES TO HOUSE ELECTRONIC DEVICES

This invention relates to the formation of a cavity in a metal work piece. More particularly, the cavity is formed by a metal deformation process. The cavity is characterized by a base surface parallel to the surfaces of the work piece and side walls perpendicular to the surfaces of the work piece. In one embodiment, the work piece is formed into a component used in metal packages. The metal packages are adapted to house an electronic device such as a semiconductor chip.

The use of a cavity to recess an electronic device is known in the art. One reason to use a recess is to position the face of the electronic device on about the same horizontal plane as the inner lead fingers of the leadframe. U.S. Pat. No. 4,682,414 illustrates the use of a recess with multi-layer circuitry and chip carriers.

It is a requirement of the electronic package that the cavity have a base surface which is flat and parallel to the surfaces of the package component. This is so an electronic device mounted in the cavity will have a bonding face essentially in alignment with a leadframe mounted on the surface of the package component. Alignment is critical to automated lead bonding. Perpendicular side walls are also required to minimize the flow of the sealant used to bond the leadframe to the package components from flowing into the cavity. Also, the lead fingers of the leadframe extend over the side wall. A dished side wall may lead to dished lead fingers and misalignment with the electronic device.

Cavities are conventionally formed by a metal removal process such as milling or chemical etching The disadvantages with a metal removal process are the time required to form each cavity and metal scrap. The metal removed rapidly becomes a problem due to metal cost and difficulty disposing small metallic chips formed as a by-product of the milling operation.

Forming the cavity by metal deformation increases production rates as well as eliminates the problem of metal scrap. Previous attempts to form the cavity were unsuccessful. The large volume of metal which must be displaced as well as difficulty in achieving a required degree of parallelism prevented the use of a metal deformation process.

Hobbing is typically used to impart a relatively shallow impression in a block of metal. Hobbing is the process of indenting or coining an impression into a cold or hot die block by pressing with a punch. Hobbing is not satisfactory for forming a cavity suitable to mount an electronic component. The cavity side walls are not perpendicular to exterior work piece surfaces. The surface of the work piece opposite the impact site is deformed by a bulge comprising displaced metal.

To control metal flow, closed die forging is frequently utilized. In closed die forging, a hot or cold work piece is deformed by a punch in order to fill a die cavity without any loss of material. The deformed metal is restrained by the die so a desired shape is obtained.

For improved shape control, complementary dies are used. As disclosed in U.S. Pat. No. 1,886,210 and U.S. Pat. No. 2,485,354, in addition to the punch having a desired shape, the die contains a shaped cavity. The work piece is disposed between the punch and die. The punch extends into the cavity deforming the metal to a desired shape.

Complementary dies are useful for deep drawing relatively thin sheets of metal. Thicker work pieces require correspondingly larger forces to drive the punch to a desired depth. Additionally, thicker metal does not flow uniformly so close tolerances are not achieved.

Some improvement in metal flow is obtained by heating the work piece prior to deformation. However, the work piece may recrystallize forming an alloy with undesirable properties. The metal or metal alloy may also react with air. Hot forming usually requires the addition of a protective coating over the metal, for example a nickel overplate or the use of a protective atmosphere about the forming die. The operational life span of the forming die is decreased by continued operation at high temperatures.

Closed die forging, preferably at elevated temperatures is disclosed in U.S. Pat. No. 4,015,461 and U.S. Pat. No. 4,252,011. Hobbing ductile metals at room temperature is disclosed in U.S. Pat. No. 3,174,318.

A unique apparatus combining principles of hobbing and closed forging as well as a unique bushing system is provided by the instant invention. The apparatus permits forming an impression such as a cavity to tighter tolerances than hobbing and at lower punch pressures than required by closed die forging. The cavity formed has a bonding surface parallel to the exterior surfaces of the work piece and cavity walls perpendicular to the exterior surfaces. The impact surface of the punch is modified in one embodiment to contain a plurality of piercing points to enable the formation of cavities having a greater depth.

It is an object of the present invention to provide a die to form a cavity in a metal work piece.

It is a feature of the invention that the cavity is characterized by a base surface which is parallel to the exterior surfaces of the work piece and side walls which are perpendicular to the exterior surfaces.

It is an advantage of the present invention that cavity formation does not generate metal scrap.

It is another advantage that the cavity may be formed more quickly than by a metal removal process.

It is a feature of the invention to provide a punch having an impact surface containing a plurality of piercing members to increase cavity depth.

It is a feature of the invention to provide a forming bushing to control metal flow during deformation.

It is an advantage of the invention that the cavities formed may be used to house an electronic device.

It is a feature of the invention that multiple dies may be utilized to achieve a cavity having a desired depth.

Accordingly, a forming die set capable of forming an impression having precise dimensional tolerances is provided. The die set comprises an extendable punch and a die body. The punch has an impact surface which is shaped into a desired pattern. The die body contains an aperture positioned to receive the punch. An opposing post and a forming bushing are positioned within the aperture. At least one forming bushing actuator is provided to activate the forming bushing.

A better understanding of the essential features of the invention will be obtained from the following specification and drawings in which like numerals depict like parts.

IN THE DRAWINGS

FIGS. 3A and 3B show a punch and a punch impact surface containing piercing points in accordance with the present invention.

FIGS. 4A and 4B show the progression of cavity shapes achieved in accordance with the present invention.

Figure 1:
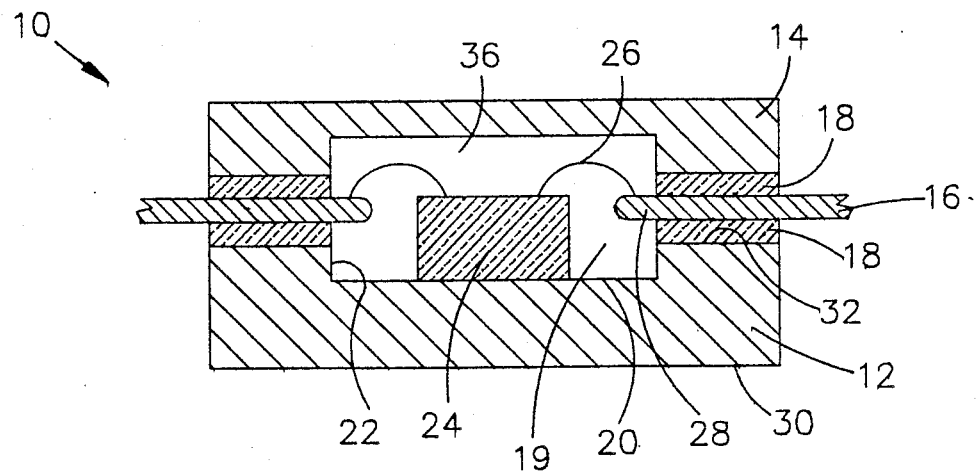
FIG. 1 illustrates in cross section an electronic package of the type which utilizes the cavities formed by the invention.

A package to house an electronic device which utilizes the cavity forming process and apparatus of the invention is shown in FIG. 1. The package 10 is comprised of a base component 12 and a cover component 14. The base and cover components are formed from a ductile material, such as a metal or metal alloy. Preferred materials include those metals commonly used for semiconductor packaging, including low coefficient of thermal expansion materials such as KOVAR and Alloy 42. Materials with higher coefficients of thermal expansion and high thermal conductivity to dissipate heat away from the electronic device, such as copper, aluminum, nickel and their alloys are also preferred. More ductile materials require less force to process. Copper, aluminum and their alloys are most preferred materials.

Disposed between the base component 12 and the cover component 14 is a leadframe 16. The leadframe is made from a conductive material having good tensile strength. The leadframe is typically comprised of copper, iron or their alloys.

A sealant 18, bonds the leadframe 16 to the base component 12 and the cover component 14. The sealant 18 may be a sealing glass in which case, the package is hermetic in accordance with Military Standard 883C or a polymer in which case the package is generally considered nonhermetic.

The base component contains a cavity 19 having a bonding surface 20 and side walls 22. An electronic device 24, for example, a semiconductor device, is bonded to the bonding surface 20 of the base component 12 by a suitable die attach means. Wire bonds 26 electrically connect the electronic device 24 to the inner leads 28 of the leadframe 16.

A package of this type utilizing a polymer adhesive sealant is disclosed in U.S. Pat. No. 4,607,276 issued to Butt, while a similar package utilizing a sealing glass is disclosed in U.S. Pat. No. 4,704,626 issued to Mahulikar et al. Polymer sealants are generally compliant. Sealing glasses are more rigid and it is preferred to match the coefficient of thermal expansion of the sealing glass with that of the base and cover components. For example, if the base and cover component are copper or a copper based alloy, the sealing glass should have a coefficient of thermal expansion of about $168 \times 10^{-7}$ in/in/°C.

Referring back to FIG. 1, wire bonds 26 electrically connect inner leads 28 to bonding sites (not shown) on the surface of the electronic device 24. The electrical connections may also be formed from thin strips of copper foil by the process known as tape automated bonding (TAB). Electrical connection to a semiconductor device, whether by wire bonding or TAB is frequently automated. Automated assembly requires a high degree of accuracy to position of electronic device relative to the leads. To accurately position the electronic device 24 relative to the leadframe 16, the bonding surface 20 should be parallel to the exterior surfaces 30, 32 of the base component. The side walls 22 are perpendicular to the exterior surfaces 30, 32 and maintain the inner leads in a proper horizontal plane.

In accordance with the present invention, a forming die is provided to form a cavity 19 having a bonding surface 20 essentially parallel to the exterior surfaces 30, 32 of the base component 12 is provided. A process involving mechanical deformation which does not create metal scrap is disclosed.

A cover or lid component 14 is bonded to the leadframe 16 encasing the electronic device and completing assembly of the package. A second cavity 36 optionally may be formed in the lid component 16 to increase the clearance between the wire or TAB bonds and a possibly electrically conductive cover component. The second cavity 36 is preferred to lessen the possibility of lead shorting during operation. The second cavity may also be formed in accordance with the process of the invention.

Figure 2:
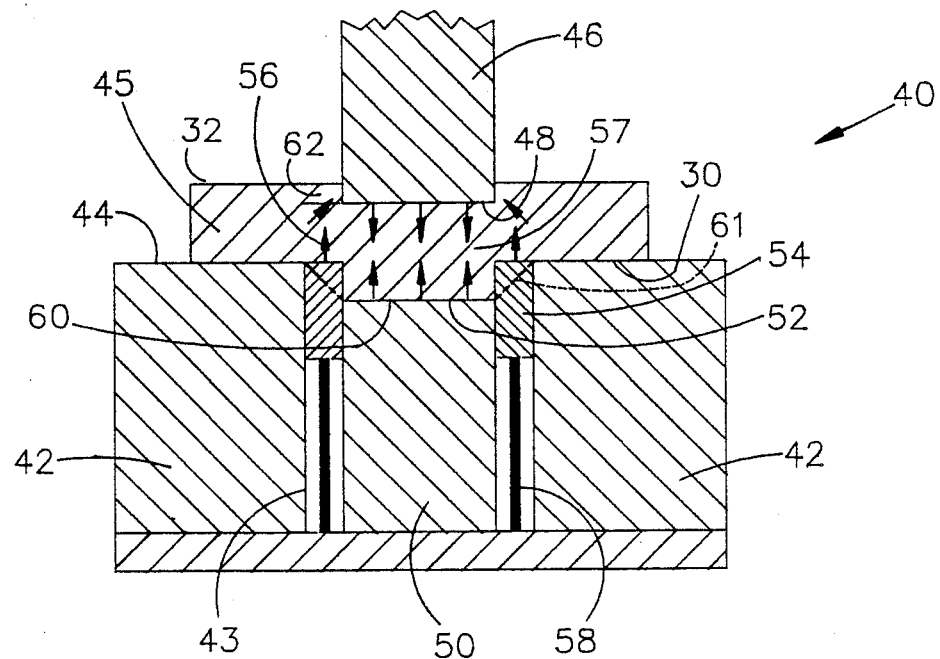
FIG. 2 illustrates in cross-section a die set comprising an embodiment of the invention.

Referring to FIG. 2, a forming die set 40 comprises a die body 42 having an aperture 43. The die body includes a surface 44 capable of supporting a work piece 45. An extendable punch 46 is driven by an external source (not shown) to penetrate the work piece 45. The external source may be any known in the art, for example, a hydraulic ram. The punch is positioned to be in alignment with the aperture 43 of the die body 42 such that the aperture 43 will receive the punch 46 or excess metal from the work piece 45 upon impact. The impact surface of the punch 48 is shaped to provide an essentially flat surface and essentially perpendicular side walls. The periphery of the punch is a desired dimension. The formed cavity will have dimensions similar to those of the punch.

An opposing post 50 is positioned within the aperture 43 in alignment with the punch 46. The post keeps the metal being deformed by the punch under compression so that the work piece 45 forms a base layer 52 which is essentially parallel to the surface 30 of the work piece 45.

The opposing post 50 alone does not create side walls, designated 22 in FIG. 1, which are perpendicular to the base surfaces 30,32. The required metal flow is obtained by the addition of a forming bushing 54.

The forming bushing 54 has an inner periphery slightly larger than the periphery of the opposing post 50. The forming bushing inner periphery has the same shape as the punch 46. While the punch is generally square or rectangular, any desired cavity shape may be obtained by shaping the impact surface 48 of the punch 46.

The forming bushing 54 engages the opposing post 50 and slides vertically along it. The opposing post serves as a guide to direct the travel of the forming bushing. When the punch 46 strikes the work piece 45, the forming bushing 54 is activated. The forming bushing moves in a direction opposite the punch and applies a compressive force, as designated by the arrows 56, to the work piece 45. The compressive force is uniform across the work piece and in an opposite direction to the compressive force designated by arrows 57 introduced by the impact of the punch 46. The parallel forces produce side walls which are essentially perpendicular to the exterior surfaces 30, 32 of the work piece The forming bushing 54 is driven by forming bushing support posts 58 which also serve as forming bushing actuators. These posts are made of a tool steel having a high compressive strength. When the punch engages the work piece, the forming bushing 54 is depressed by elastic compression of the support posts 58. The support posts 58 have a cross-sectional area which is smaller than the cross-sectional area of either the forming bushing or the die body 42. The maximum stress for a compressive force applied by the punch 46 is located at the support posts. The support posts therefore compress at a force lower than the force capable of deforming the die body or forming bushing. The support posts elastically relax applying a force 56 against the work piece 45 in a direction opposite to but parallel to the forces 57 applied by the punch 46.

The die body 42 is made from any material capable of being subjected to repeated impact, for example a high quality tool steel such as that designated by the American Iron and Steel Institute (AISI) as AISI-01. The dimensions of the die body 42 are sufficient to minimize elastic deformation during stamping. The die body may further contain an indexing means as known in the art. An indexing means is preferred so a series of cavities may be made in a long length of metal strip. An automated process such as stamping from a continuous strip increases production rates over a batch process involving loading and stamping of individual parts.

The opposing post 50 is manufactured from a high strength material, such as AISI-01. The geometry of the opposing post is selected so that when positioned within the aperture 43 of the die body 42, the impact surface of the opposing post 60 is recessed below the surface 44 of the die body 42 by a distance about equal to the depth of penetration 62 of the punch 46. This is so the volume of metal displaced by the punch will have a cavity of equal volume into which to flow. The peripheral dimension of the impact surface 60 is about equal to the peripheral dimension of the impact surface 48 of the punch 46.

The use of a recessed opposing post 50 will not produce a cavity in the work piece of the desired dimensions. Metal flow at the edges of the recess is limited and regardless of the rigidity of the die body 42, some deformation occurs at the edges of the recess. Metal flow alng the punch 46 is inhibited and dished side walls result.

The forming bushing 54 provides a unique solution to the problem of dishing of the side walls designated 22 in FIG. 1 of the cavity. The forming bushing has an inside diameter slightly larger then the peripheral dimension of the opposing post 50. The forming bushing fits over the opposing post and is capable of movement. When the punch 46 impacts the work piece 45 a two stage process is believed to be initiated. The force applied to the work piece is transmitted to the forming bushing 54 and to the forming bushing supports 58. The force is sufficient to compress the forming bushing supports. The compression of the forming bushing supports 58 lowers the forming bushing 54 forming a low friction region 61 capable of accommodating metal flow. Metal flows readily from the punch forming a cavity with a flat base surface and side walls which are slightly dished Very rapidly, on the order of milli-seconds and prior to removal of the punch 46 from the work piece 45, the forming bushing supports 58 return to the non-compressed position. This relaxation drives the forming bushing 54 into the low friction region 61. The metal occupying the low friction region is driven back into the work piece as designated by the stress representing arrows 56. The metal flows along the sides of the punch 46 creating side walls, designated 22 in FIG. 1, which are parallel to the base surfaces 30, 32. The geometry of the metal remaining in the cavity formed by the forming bushing 54 and the opposing post 50 is not critical. The material remaining is usually removed, such as by grinding, prior to package assembly.

The depth of travel of the forming bushing is about equal to the depth of the cavity and is preferably from about 0.020 inches to about 0.030 inches. For reasons related to shearing as discussed hereinbelow, the use of a punch having an impact surface 48 as shown in FIG. 2 is limited to cavity depths not exceeding about 33% of the overall thickness of the work piece.

A plurality of bushing actuators 58 support the bushing 54. The bushing actuators are located, preferably as four equally spaced supports around the periphery of the opposing post 50. A sufficient number of bushing actuators are supplied so the force applied by the punch 46 remains within the elastic range of the bushing actuators. It has been found that four bushing actuators manufactured from a high tensile strength material such as AISI-S1 which has the approximate composition 0.55% C, 0.25% Mn, 0.25% Si, 1.25% Cr, 0.2% V, 2.75% W and the balance iron (where all percentages are given as weight percent) are generally sufficient. When the punch 46 strikes the work piece 45, the bushing 54 is forced downward. The bushing actuators 58 elastically compress and then elastically spring back within a very short time, on the order of milli-seconds. This rapid compression followed by expansion of the bushing actuators 58 forces the bushing 54 into the work piece 45 resulting in the formation of perpendicular side walls.

The depth of penetration of the punch 46 is related to the hardness of the work piece 45 and the force driving the punch. Increasing the tonnage of the press increases the depth of penetration up to the shear limit. The shear limit is the depth of penetration beyond which the metal cracks. For ductile metals and alloys, this shear limit is typically about 33% the overall thickness of the work piece.

As the penetration depth increases as a fraction of the overall work piece thickness, shearing becomes more prevalent. Shearing results in the formation of microcracks along the sidewalls of the package. Penetration depths exceeding about 33% of the overall work piece thickness are difficult to accomplish with a punch 46 having a flat impact surface 48.

An improved impact surface capable of penetration depths greater than about 50% of the overall work piece thickness is shown in FIGS. 3A and 3B. The punch 64 has an impact surface 68 shaped with a series of piercing points 70. An exemplary piercing structure is a series of wedge shaped pyramids spaced along the impact surface 68 as shown in FIG. 3B. While the piercing points 70 are shown as pyramids, they may be any desired shape which facilitates penetration, for example, tapered points.

A piercing and stamping sequence as shown in FIGS. 4A and 4B is useful to produce cavities with improved depth. A first punch (not shown) impacts the work piece 72. The first punch contains a series of piercing points and forms a relatively shallow cavity 74. The cavity base 76 contains a plurality of indentations 78 corresponding to the piercing points of the punch. The force of the punch is concentrated at the piercing points increasing the depth of penetration for a given tonnage press.

A second punch (not shown) having a smooth impact surface next strikes the work piece in the same cavity location flattening the cavity base 80 as shown in FIG. 4B. Metal flow is perpendicular to the direction of punch travel, into the indentations formed by the first punch. The resultant cavity has a smooth cavity base 80 and sidewalls 82 which are perpendicular to the base surfaces 84,86 of the work piece 72.

Progressive repetitions comprising impacting the work piece with the piercing point containing punch followed by the flat impact surface punch result in a cavity having essentially flat surfaces and walls perpendicular to the surface of the base of the work piece. A sequence of two repetitions has been found to produce a cavity having a depth of in excess of 20% of the overall work piece thickness. Increasing the number of repetitions increases the achievable penetration depth to in excess of about 50% of the overall work piece thickness, well in excess of the conventionally defined shear limit of 33%.

The punches are selected to have a hardness greater than that of the work piece. Preferred work pieces are copper and aluminum or alloys of those metals to take advantage of high thermal conductivity so most tooling steels are acceptable. To manufacture package components from iron-nickel alloys or stainless steel or other low coefficient of thermal expansion, a suitable tooling material must be used, for example, AISI-01.

Soft ductile materials such as copper, aluminum and certain alloys of these metals flow readily when struck with the progression of punches detailed above. It has been found with these materials the opposing post and forming bushing are not required and, optionally, may be excluded from the die set when the work piece is sufficiently soft.

Figure 5:
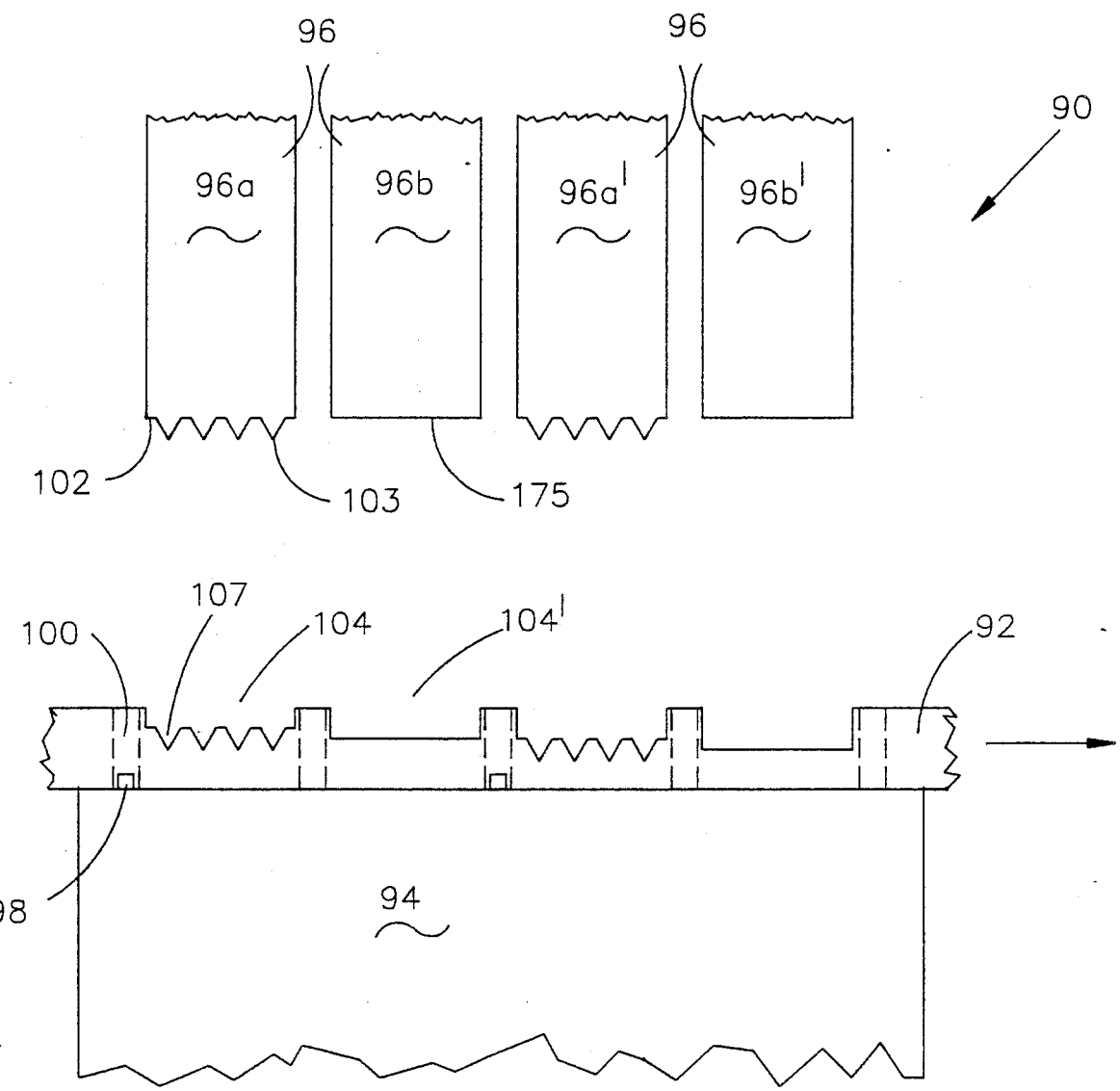
FIG. 5 illustrates in cross-section a progressive die sequence for forming cavities having an increased depth.

FIG. 5 illustrates a progressive die 90 in accordance with the present invention. A metal strip work piece 92 is supplied in coil form from a pay out roll (not shown). The strip is pulled by a driven take up roll (not shown) along a surface of a die body 94. A plurality of extendable punches 96 are positioned such that the metal strip work piece 92 passes between the punches 96 and the die body 94. An indexing mechanism may be provided for accurate positioning of the work piece.

A suitable indexing mechanism comprises a series of pins 98 designed to mate with sprocket holes 100 which have been formed in the metal strip work piece 92.

The metal strip work piece 92 enters the progressive die 90 and is deformed by a first punch 96a. The first punch has an impact surface 102 comprised of a plurality of piercing points 103. The first punch 96a forms a first impression 104 in the metal strip work piece 92.

The metal strip work piece is advanced to a second position such that a second punch 96b impacts the metal strip at the first impression 104. The second punch has a second impact surface 105 which is essentially flat. The metal strip work piece 92 is deformed. A portion of the displaced metal flows into the wedge shaped cavities 107 formed by the first punch 96a. A second impression 104' having a desired flat and parallel base surface as well as perpendicular side walls is formed. The depth of the second impression 104' is about 50% the depth of greatest penetration of the wedge shaped cavities 107 of the first impression 104.

The sequence is repeatable as by a second sequence of punches 96a' and 96b'. The pattern of impact surfaces alternates between piercing points 102 and essentially flat 105. Each repetition of the sequence increases the cavity depth by up to about 0.020 inches. Cavities of a desired depth in excess of about 50% the overall work piece thickness are obtainable.

As discussed hereinabove, the die body may be solid if the work piece comprises a soft ductile material such as copper, aluminum or their alloys. If a harder material is being deformed, an opposing post and forming bushing positioned in alignment with each punch may be preferred. Alternatively, the opposing post and forming bushing may be incorporated only with the punches containing impact surfaces which are essentially flat.

The die sequence need not be a continuous process. A batch process where a collection of blanks is stamped with a first impression may be followed by a second batch process wherein the same collection of blanks is stamped with a second impression. The batch process may be repeated as often as necessary to acquire the desired cavity depth.

The patents and applications set forth in this application are incorporated by reference in their entireties.

It is apparent there has been provided in accordance with this invention a die set and process of stamping a cavity into a metallic work piece which satisfy the objects, means and advantages set forth hereinabove. While the invention has been described in combination with the embodiments thereof, it is evident that many alternatives, modifications and variations will be apparent to those skilled in the art in light of the foregoing description. Accordingly, it is intended to embrace all such alternatives, modifications and variations as fall within the broad scope of the appended claims.

We claim:
1. A forming die set, comprising:
   an extendable punch having a first impact surface comprising a plurality of piercing points;
   a die body containing an aperture adapted to receive said punch;
   a fixed opposing post having a second impact surface positioned within said aperture, said opposing post recessed below a surface of said die body;
   at least one forming bushing slideably engaging said opposing post and positioned between said opposing post and said die body; and
   at least one forming bushing actuator supporting said at least one forming bushing.
2. The die set of claim 1 wherein said piercing points comprise a plurality of pyramid shaped structures.
3. The die set of claim 1 wherein said said die body includes an indexing means.
4. The die set of claim 3 wherein said second impact surface has a peripheral dimension about equal to the peripheral dimension of said first impact surface.
5. The die set of claim 3 wherein said opposing post is recessed below the surface of said die body to a depth approximately equal to the depth said punch penetrates a desired workpiece.
6. The die set of claim 5 wherein said opposing post is recessed below the surface of said die body by from about 0.020 inches to about 0.030 inches.
7. The die set of claim 4 wherein said forming bushing is driven by a plurality of equally spaced bushing actuators.
8. The die set of claim 7 wherein said plurality of bushing actuators are comprised of an alloy containing about 0.55% by weight C, about 0.25% by weight Mn, about 0.25% by weight Si, about 1.25% by weight Cr, about 0.2% by weight V, about 2.75% by weight W and the balance iron.

9. A progressive sequence of dies for forming a cavity having a desired length, width and depth, comprising:
   a plurality of extendable punches, each with an impact surface, said impact surfaces alternating between a first desired pattern comprising a plurality of piercing points and a second desired pattern comprising an essentially flat surface, the length and width of each said impact surface approximately equal to the desired length and width of said cavity;
   a die body including a plurality of apertures adapted to receive each said punch;
   an opposing post positioned within each said aperture having an impact surface congruent with each said impact surface; and
   at least one moveable forming bushing supported by at least one forming bushing actuator slideably engaged to each said opposing post.

10. The progressive sequence of dies of claim 9 wherein said opposing post is recessed below a surface of said die body.

11. The progressive sequence of dies of claim 10 wherein said opposing post is recessed below a surface of said die body to a depth approximately equal to the depth said punch penetrates a desired work piece.

12. A process for forming a cavity within a workpiece, comprising the steps of:
   penetrating said workpiece with a punch having a first impact surface defining the perimeter of said cavity comprising a plurality of piercing points;
   impacting said pierced portion of said metal workpiece with a punch having an essentially flat impact surface such that the depth of said cavity is about 50% the depth of penetration; and
   repeating said penetrating and impacting steps until a cavity having a desired depth is achieved.

13. The process of claim 12 including supplying an indexing means to position said metal work piece.

14. The process of claim 13 wherein said indexing means comprises a plurality of spaced sprocket holes running along the edges of a work piece comprising a continuous strip.

15. The process of claim 12 including providing said first impact surface with a plurality of pyramid shaped structures.

16. The process of claim 12 including repeating said impacting steps until a cavity having a depth in excess of about 33% of the overall work piece thickness is obtained.

17. The process of claim 16 including repeating said impacting steps until a cavity having a depth of about 50% of the overall work piece thickness is obtained.

* * * * *